United States Patent
Flachowsky et al.

(10) Patent No.: US 8,642,430 B2
(45) Date of Patent: Feb. 4, 2014

(54) PROCESSES FOR PREPARING STRESSED SEMICONDUCTOR WAFERS AND FOR PREPARING DEVICES INCLUDING THE STRESSED SEMICONDUCTOR WAFERS

(75) Inventors: Stefan Flachowsky, Dresden (DE); Thilo Scheiper, Dortmund (DE)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 13/442,683

(22) Filed: Apr. 9, 2012

(65) Prior Publication Data

US 2013/0267078 A1    Oct. 10, 2013

(51) Int. Cl.
*H01L 21/02* (2006.01)
*H01L 33/16* (2010.01)
*H01L 33/12* (2010.01)

(52) U.S. Cl.
USPC ........... 438/282; 438/146; 438/163; 257/190; 257/E29.051; 257/E29.27; 257/E21.629

(58) Field of Classification Search
CPC .......................... H01L 29/1054; H01L 29/107
USPC .............................. 257/E29.193, 18–19, 190, 257/E29.049–E29.051, E29.056–E29.27, 257/E29.299, E21.629, E21.633, E21.643; 438/175, 282, 142, 146, 147, 163
See application file for complete search history.

(56) References Cited

U.S. PATENT DOCUMENTS

| | | | |
|---|---|---|---|
| 7,566,606 B2* | 7/2009 | Currie et al. ................. | 438/199 |
| 7,632,724 B2* | 12/2009 | Chidambarrao et al. ..... | 438/153 |
| 7,888,197 B2* | 2/2011 | Chidambarrao et al. ..... | 438/221 |
| 8,062,952 B2* | 11/2011 | Hoentschel et al. .......... | 438/424 |
| 8,329,551 B2* | 12/2012 | Flachowsky et al. ......... | 438/387 |
| 2005/0106792 A1* | 5/2005 | Cea et al. ...................... | 438/197 |
| 2006/0001089 A1* | 1/2006 | Bedell et al. .................. | 257/347 |
| 2006/0081837 A1* | 4/2006 | Bedell et al. .................... | 257/19 |
| 2007/0017438 A1* | 1/2007 | Xie et al. ......................... | 117/95 |
| 2007/0032009 A1* | 2/2007 | Currie et al. ................. | 438/199 |
| 2007/0069294 A1* | 3/2007 | Chidambarrao et al. ..... | 257/351 |
| 2007/0134879 A1* | 6/2007 | Kim et al. ...................... | 438/300 |
| 2007/0254422 A1* | 11/2007 | Chidambarrao et al. ..... | 438/197 |
| 2007/0254423 A1* | 11/2007 | Chidambarrao et al. ..... | 438/197 |
| 2009/0242989 A1* | 10/2009 | Chan et al. .................... | 257/351 |
| 2012/0049280 A1* | 3/2012 | Clifton et al. ................. | 257/347 |
| 2012/0261725 A1* | 10/2012 | Flachowsky et al. ......... | 257/288 |
| 2012/0326241 A1* | 12/2012 | Haran et al. .................. | 257/401 |

* cited by examiner

*Primary Examiner* — Laura M Menz
*Assistant Examiner* — Maliheh Malek
(74) *Attorney, Agent, or Firm* — Ingrassia Fisher & Lorenz, P.C.

(57) ABSTRACT

Processes for preparing a stressed semiconductor wafer and processes for preparing devices including a stressed semiconductor wafer are provided herein. An exemplary process for preparing a stressed semiconductor wafer includes providing a semiconductor wafer of a first material having a first crystalline lattice constant. A stressed crystalline layer of a second material having a different lattice constant from the first material is pseudomorphically formed on a surface of the semiconductor wafer. A first via is etched through the stressed crystalline layer and at least partially into the semiconductor wafer to release stress in the stressed crystalline layer adjacent the first via, thereby transferring stress to the semiconductor wafer and forming a stressed region in the semiconductor wafer. The first via in the semiconductor wafer is filled with a first filler material to impede dissipation of stress in the semiconductor wafer.

18 Claims, 2 Drawing Sheets

PROCESSES FOR PREPARING STRESSED SEMICONDUCTOR WAFERS AND FOR PREPARING DEVICES INCLUDING THE STRESSED SEMICONDUCTOR WAFERS

TECHNICAL FIELD

The present invention generally relates to processes for preparing stressed semiconductor wafers and devices including the stressed semiconductor wafers. More particularly, the invention relates to processes for imparting stress to semiconductor wafers and for preparing devices including the resulting stressed semiconductor wafers.

BACKGROUND

Semiconductor wafers find wide-ranging use in electronic devices, such as microprocessors, microcontrollers, and application-specific integrated circuits, as substrates for metal oxide semiconductor (MOS) transistors. MOS transistors generally include a gate electrode formed above the semiconductor wafer, with the gate electrode being insulated from the semiconductor wafer by a thin layer of gate insulator material. A source and a drain are spaced apart regions of either N-type or P-type semiconductor material and are generally embedded within the semiconductor wafer adjacent to the gate electrode on either side thereof. A region in the semiconductor wafer between the source and the drain, and beneath the gate electrode, forms a channel of the MOS transistor.

It is known that the mobility of charge carriers, i.e., electrons and holes, in the channel can be increased when the semiconductor wafer is stressed in the channel. Depending upon the type of transistor, different types of stress have different effects on carrier mobility. For example, the mobility of electrons in the channel of an NMOS transistor can be increased by applying a tensile stress to the channel in the semiconductor wafer, whereas the mobility of holes in the channel of a PMOS transistor can be increased by applying compressive stress to the channel in the semiconductor wafer.

Stress can be introduced into semiconductor wafers using a global approach, in which biaxial stress is introduced across a surface of the semiconductor wafer along two axes, or a local approach, in which uniaxial stress is introduced into the semiconductor wafer at discreet locations in the semiconductor wafer along a single axis. To introduce stress into semiconductor wafers using the global approach, exemplary structures including silicon germanium (SiGe) stress-relaxed buffer layers or silicon carbide (SiC) stress-relaxed buffer layers can be formed on the surface of the semiconductor wafer. To introduce stress into semiconductor wafers using the local approach, stress is introduced only to local areas adjacent to the channel of the transistor from a local structure such as, for example, a stress liner, embedded silicon SiGe source/drain structures, embedded SiC source/drain structures, and stress-generating shallow trench isolation structures. Due to easier integration within device formation processes, local approaches to introduction of stress into semiconductor wafers have generally been favored, although global approaches to introduction of stress generally enable stronger and more uniform stress to be introduced than local approaches.

In view of the foregoing, there is an opportunity to provide novel processes for preparing semiconductor wafers by which biaxial stress can be introduced into the semiconductor wafers. There is also an opportunity to provide processes for preparing devices including a stressed semiconductor wafer in which biaxial stress is introduced therein through the novel process. Furthermore, other desirable features and characteristics of the present invention will become apparent from the subsequent detailed description of the invention and the appended claims, taken in conjunction with the accompanying drawings and this background of the invention.

BRIEF SUMMARY

Processes for preparing a stressed semiconductor wafer, as well as processes for preparing devices including a stressed semiconductor wafer, are provided herein. In an embodiment, a process for preparing a stressed semiconductor wafer includes providing a semiconductor wafer of a first material having a first crystalline lattice constant. A stressed crystalline layer of a second material having a different crystalline lattice constant from the first material is pseudomorphically formed on a surface of the semiconductor wafer. A first via is etched through the stressed crystalline layer and at least partially into the semiconductor wafer to release stress in the stressed crystalline layer adjacent the first via, thereby transferring stress to the semiconductor wafer and forming a stressed region in the semiconductor wafer. The first via in the semiconductor wafer is filled with a first filler material to impede dissipation of stress in the semiconductor wafer.

In another embodiment, a process for preparing a device including a stressed semiconductor wafer includes providing a semiconductor wafer of a first material having a first crystalline lattice constant. A stressed crystalline layer of a second material having a different crystalline lattice constant from the first material is pseudomorphically formed on a surface of the semiconductor wafer. A first via is etched through the stressed crystalline layer and at least partially into the semiconductor wafer to release stress in the stressed crystalline layer adjacent the first via, thereby transferring stress to the semiconductor wafer and forming a stressed region in the semiconductor wafer. The first via in the stressed semiconductor wafer is filled with a first filler material to impede dissipation of stress in the stressed region of the semiconductor wafer. A transistor is formed on the stressed semiconductor wafer within the stressed region thereof.

In another embodiment, a process for preparing a stressed semiconductor wafer includes providing a semiconductor wafer of a first material having a first crystalline lattice constant. A stressed crystalline layer of a second material having a different crystalline lattice constant from the first material is pseudomorphically formed on a surface of the semiconductor wafer. A first via and a second via are etched through the stressed crystalline layer and at least partially into the semiconductor wafer to release stress in the stressed crystalline layer adjacent the first via, thereby transferring stress to the semiconductor wafer and forming a stressed region in the semiconductor wafer with the stressed region of the semiconductor wafer disposed between the first via and the second via. The first via and the second via in the semiconductor wafer are filled with a first filler material and a second filler material to impede dissipation of stress in the semiconductor wafer. The stressed crystalline layer is removed from the semiconductor wafer after filling the first via and the second via in the semiconductor wafer.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Processes for preparing a stressed semiconductor wafer and for preparing devices including a stressed semiconductor wafer are provided herein. The processes for preparing the stressed semiconductor wafer enable biaxial stress to be introduced into the semiconductor wafer through transfer of stress from a pseudomorphically-formed stressed crystalline layer to the semiconductor wafer by selective release of stress in the stressed crystalline layer through etching a first via through the stressed crystalline layer. The first via is also at least partially etched into the semiconductor wafer and the first via in the semiconductor wafer is then filled with a filler material, which impedes dissipation of stress in the semiconductor wafer after transfer of the stress from the stressed crystalline layer. In this manner, the biaxial stress is introduced into the semiconductor wafer itself and the stressed crystalline layer may optionally be removed without stress in the semiconductor wafer materially dissipating. As a result, the stressed semiconductor wafer may be provided independent of any requirement for stressed crystalline layers thereon, with the stressed crystalline layer absent from the stressed semiconductor wafer if desired to provide a stand-alone stressed semiconductor wafer (albeit with the filled first via included therein). The stressed semiconductor wafer can easily be integrated into existing processes for preparing devices that include stressed semiconductor wafers, such as devices that include transistors formed on semiconductor wafers. In any event, the transfer of stress from the stressed crystalline layer to the semiconductor wafer represents a novel approach for introducing biaxial stress into semiconductor wafers.

Figure 1:
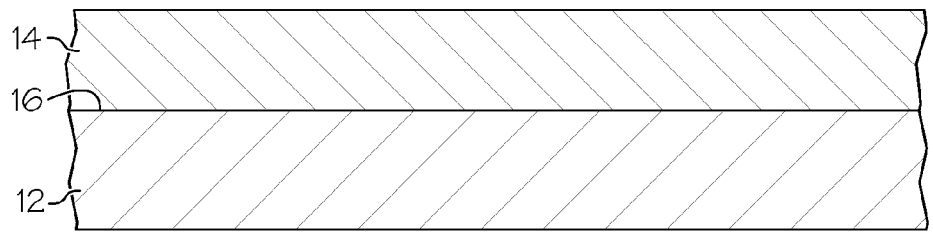
FIG. 1 is a schematic cross-sectional side view of an initially-provided semiconductor wafer and a stressed crystalline layer pseudomorphically formed thereon in accordance with an embodiment of a process of the instant invention.

An exemplary embodiment of a process for preparing a stressed semiconductor wafer 10 will now be addressed with reference to FIGS. 1-4. In this embodiment, the stressed semiconductor wafer 10 is prepared having tensile stress therein, which is ideal when an NMOS transistor is to be included on the stressed semiconductor wafer 10 due to increased mobility of electrons through the tensily stressed semiconductor wafer 10. Referring to FIG. 1, a semiconductor wafer 12 of a first material having a first crystalline lattice constant is provided, and the semiconductor wafer 12 generally has a lattice structure that naturally forms based on the first crystalline lattice constant to generate minimal stress in the semiconductor wafer 12. The first material may be any semiconductor material that is known for industrial use in electronic devices. Examples of the first material include, but are not limited to, those chosen from silicon, silicon germanium (SiGe), germanium (Ge), gallium arsenide (GaAs), or indium phosphide (InP). For example, in an embodiment, when the first material is silicon, the silicon is present in an amount of from about 95 to about 100 mol %, such as from about 99 to about 100 mol %, based upon the total amount of atoms in the semiconductor wafer 12. The silicon may be substantially pure, i.e., dopants and/or impurities are present in amounts of less than or equal to 1 mol % based upon the total amount of atoms in the semiconductor wafer 12 and are desirably absent from the semiconductor wafer 12.

Thickness of the semiconductor wafer 12 may impact the dynamics by which stress is introduced therein. In an embodiment, the semiconductor wafer 12 is further defined as a silicon-on-insulator (SOI) wafer and has a thickness of from about 50 to about 1500 nm, such as from about 50 to about 300 nm. In another embodiment, the semiconductor wafer 12 is further defined as a bulk silicon wafer and has a thickness of up to 1 mm, such as from about 500 to about 750 μm. Thicknesses of the semiconductor wafer 12 within the above ranges are sufficiently thin to enable stress to be introduced therein while remaining sufficiently thick to minimize the incidence of cracking or breakage.

The process continues with pseudomorphically forming a stressed crystalline layer 14 of a second material having a different crystalline lattice constant from the first material on a surface 16 of the semiconductor wafer 12, as also shown in FIG. 1. "Pseudomorphically forming" the stressed crystalline layer 14, as described herein, refers to epitaxially forming the stressed crystalline layer 14 directly upon the surface 16 of the semiconductor wafer 12 from the second material such that the stressed crystalline layer 14 has the same lattice structure as the first material in the semiconductor wafer 12. However, because the second material has the different crystalline lattice constant from the first material, stress is generated within the stressed crystalline layer 14. Examples of the second material include, but are not limited to, any of the materials listed above for the first material and, additionally, silicon carbide (SiC), provided that common material is not employed as the first material and the second material. Like the semiconductor wafer 12, the stressed crystalline layer 14 may have a thickness of from about 50 to about 1500 nm, such as from about 50 to about 300 nm.

In the embodiment shown in FIGS. 1-4, the second material has a greater crystalline lattice constant than the first material. In this embodiment, the stressed crystalline layer 14 is pseudomorphically formed under compressive stress on the surface 16 of the semiconductor wafer 12 due to the actual lattice structure in the stressed crystalline layer 14 being less than the crystalline lattice constant of the second material. The semiconductor wafer 12 remains effectively unstressed after pseudomorphically forming the stressed crystalline layer 14 thereon because the actual lattice structure in both the stressed crystalline layer 14 and the semiconductor wafer 12 generally matches the first crystalline lattice constant of the first material. In one specific example, the semiconductor wafer 12 is a silicon-containing wafer 12 that includes silicon in an amount of from about 95 to about 100 mol % based upon the total amount of atoms in the silicon-containing wafer 12. The silicon-containing wafer 12 has a thickness of from about 50 to about 1500 nm, such as from about 50 to about 350 nm. The stressed crystalline layer 14 is a SiGe layer 14 that is pseudomorphically formed on the surface 16 of the silicon-containing wafer 12, where SiGe is the second material. The SiGe layer 14 has a germanium content of from about 20 to about 40 mol % based upon the total amount of atoms in the SiGe layer 14. The SiGe layer 14 has a thickness of from about 50 to about 1500 nm, such as from about 50 to about 200 nm. The germanium replaces silicon at lattice sites in the crystalline structure of the SiGe layer 14, and because germanium is a larger atom than silicon, the crystalline lattice constant of SiGe is greater than the crystalline lattice constant of silicon. However, because the SiGe layer 14 is pseudomorphically formed on the surface 16 of the silicon-containing wafer 12, the SiGe layer 14 has the same lattice structure as the substantially pure silicon in the semiconductor wafer 12. Therefore, the SiGe layer 14 is formed under compressive stress and exhibits the compressive stress through the bulk thereof.

Figure 2:
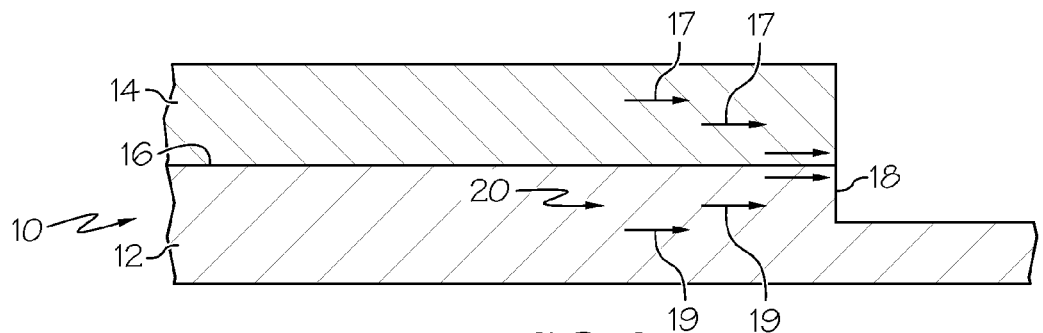
FIG. 2 is a schematic cross-sectional side view of the semiconductor wafer and stressed crystalline layer disposed thereon, as shown in FIG. 1, with a first via etched through the stressed crystalline layer and partially etched into the semiconductor wafer.

Referring to FIG. 2, a first via 18 is etched through the stressed crystalline layer 14 and at least partially into the semiconductor wafer 12 to release stress in the stressed crystalline layer 14 adjacent the first via 18, thereby transferring stress to the semiconductor wafer 12 and forming a stressed region 20 in the semiconductor wafer 12. By etching the first via 18 completely through the stressed crystalline layer 14, the stressed crystalline layer 14 is allowed to relax adjacent to the first via 18. Relaxation of the stressed crystalline layer 14 adjacent to the first via 18 transfers stress to the semiconductor wafer 12 generally in the same direction as relaxation of the stressed crystalline layer 14. For example, in the embodiment shown in FIG. 2, where the stressed crystalline layer 14 is pseudomorphically formed under compressive stress, relaxation of the stressed crystalline layer 14 results in expansion of the stressed crystalline layer 14 into the first via 18 (illustrated by the arrows 17 within the stressed crystalline layer 14 in FIG. 2), with stress transferred to the semiconductor wafer 12 in the same direction as expansion of the stressed crystalline layer 14 (illustrated by the arrows 19 in the semiconductor wafer 12 as shown in FIG. 2). As a result, the semiconductor wafer 12 is under tensile stress after relaxation of the compressively stressed crystalline layer 14 of this embodiment.

As set forth above, the first via 18 is at least partially etched into the semiconductor wafer 12. In an embodiment, the first via 18 is only partially etched into the semiconductor wafer 12, which promotes transfer of stress into the semiconductor wafer 12 through relaxation of the stressed crystalline layer 14 and further promotes build-up of stress in the semiconductor wafer 12 adjacent to the first via 18. As an example, in this embodiment, the first via 18 is etched into the semiconductor wafer 12 to a depth of from about 10 to about 100 nm, such as from about 20 to about 50 nm, from the surface 16 of the semiconductor wafer 12, provided that the first via 18 is only partially etched into the semiconductor wafer 12. Depth of the first via 18 beyond 100 nm, as well as complete etching of the first via 18 through the semiconductor wafer 12, may allow for undesirable relaxation of the semiconductor wafer 18. Stress transfer from the stressed crystalline layer 14 to the semiconductor wafer 12 may depend upon the types of the first material and the second material, as well as actual thickness and volume of the stressed crystalline layer 14 and the semiconductor wafer 12. Exemplary stress transfer percentages, based upon amount of stress in the stressed crystalline layer 14 that are transferred to the semiconductor wafer 12, can range from about 30 to about 60% in specific areas within the semiconductor wafer 12 depending upon the above factors and further depending upon the design of the first via 18. For example, a compressively stressed SiGe layer 14 having a thickness of from about 50 to about 200 nm and a stress of from about 1000 to about 1500 Mpa can transfer from about 500 to about 900 Mpa of tensile stress into specific areas of a silicon-containing wafer 12 having a thickness of from about 50 to about 350 nm.

Figure 3:
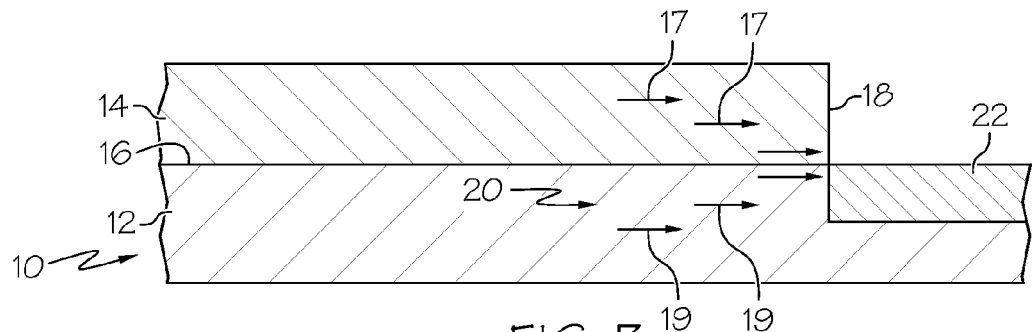
FIG. 3 is a schematic cross-sectional side view of the semiconductor wafer and stressed crystalline layer disposed thereon, as shown in FIG. 2, with the first via filled with a first filler material.

Referring to FIG. 3, the first via 18 in the semiconductor wafer 12 is filled with a first filler material 22 to impede dissipation of stress in the semiconductor wafer 12. More specifically, filling the first via 18 in the semiconductor wafer 12 with the first filler material 22 serves to maintain the stressed condition of the semiconductor wafer 12 adjacent to the first via 18 by replacing the first material that is removed during etching, thereby impeding the semiconductor wafer 12 from returning to the unstressed condition. The first filler material 22 is not particularly limited, but should be sufficiently rigid to measurably impede dissipation of stress in the semiconductor wafer 12, e.g., less dissipation of stress in the semiconductor wafer 12 should be observed when the first via 18 is filled with the first filler material 22 as compared to dissipation of stress in the semiconductor wafer 12 when the first via 18 is left unfilled after removal of the stressed crystalline layer 14. In an embodiment, the first filler material 22 is crystalline filler material and the crystalline filler material is epitaxially formed in the first via 18. Crystalline filler material that is epitaxially formed in the first via 18 may be particularly effective for impeding dissipation of stress in the semiconductor wafer 12 when the semiconductor wafer 12 is under tensile stress. Further, the crystalline filler material may be employed to generate uniaxial local stress within the semiconductor wafer 12. Examples of suitable crystalline filler materials include any of the materials set forth above as suitable for the first material of the semiconductor wafer 12 or the second material of the stressed crystalline layer 14. Further examples of suitable filler materials include silicon oxide and silicon nitride. In another embodiment, the first filler material 22 is electrically-conductive material and may have sufficient electrical conductivity to facilitate electrical connection in a circuit, e.g., with electrical resistivity of less than or equal to about 30 $\mu\Omega\cdot cm$. The first via 18 in the semiconductor wafer 12 is filled with the electrically-conductive material, which may function as an interconnect or electrical contact for a device 24 in the semiconductor wafer 12. Examples of suitable electrically-conductive materials include metals such as, but not limited to, copper, titanium, or tungsten. Other suitable electrically-conductive materials include electrically-conductive ceramics such as titanium nitride.

Figure 4:
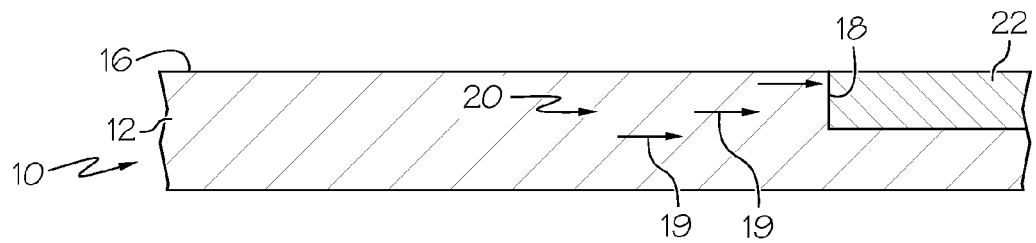
FIG. 4 is a schematic cross-sectional side view of the semiconductor wafer, as shown in FIG. 3, with the stressed crystalline layer removed from the semiconductor wafer.

Referring to FIG. 4, the stressed crystalline layer 14 may be removed from the semiconductor wafer 12 after etching the first via 18 through the stressed crystalline layer 14 and at least partially into the semiconductor wafer 12. In the embodiment of FIG. 4, the stressed crystalline layer 14 is removed from the semiconductor wafer 12 after filling the first via 18 in the semiconductor wafer 12 with the first filler material 22. However, it is to be appreciated that the stressed crystalline layer 14 may be removed prior to filling the first via 18 so long as material dissipation of stress in the semiconductor wafer 12 is avoided. Conventional techniques for removing the stressed crystalline layer 14 may be employed such as, for example, etching the stressed crystalline layer 14 using an appropriate etchant. After removing the stressed crystalline layer 14, the stressed semiconductor wafer 10 may exist in a form that can be expediently used in preparation of devices 24 that employ the semiconductor wafer 12. Alternatively, although not shown, an additional stressed crystalline layer 14 may be epitaxially formed directly upon the semiconductor wafer 12, after removing the stressed crystalline layer 14. The additional stressed crystalline layer 14 may be the same as or different from the stressed crystalline layer 14 described above. Another via may be etched in the additional stressed crystalline layer 14 and the additional stressed crystalline layer 14 may be removed, as described above, to generate further stress in the semiconductor wafer 12.

Figure 5:
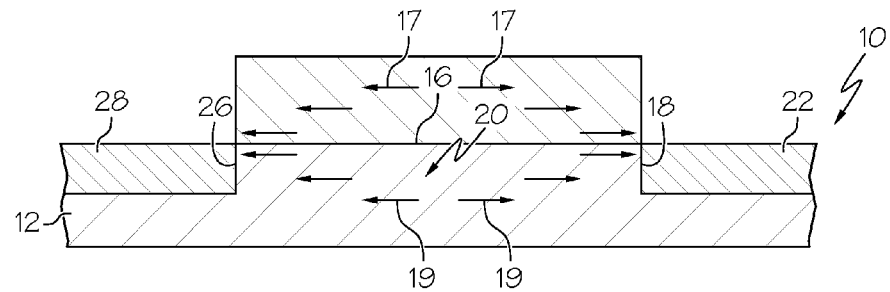
FIG. 5 is a schematic cross-sectional side view of the semiconductor wafer and stressed crystalline layer disposed thereon, as shown in FIG. 1, with a first via and a second via etched through the stressed crystalline layer and partially etched into the semiconductor wafer in accordance with another embodiment of a process of the instant invention.

In another exemplary embodiment of a process for preparing a stressed semiconductor wafer 10, the semiconductor wafer 12 is provided and the stressed crystalline layer 14 is pseudomorphically formed on the surface 16 of the semiconductor wafer 12, as shown in FIG. 1. Referring to FIG. 5, the first via 18 is etched through the stressed crystalline layer 14 and at least partially into the semiconductor wafer 12, and a second via 26 is also etched through the stressed crystalline layer 14 and at least partially into the semiconductor wafer 12. The second via 26 may be etched in the same manner as the first via 18, and may be concurrently etched with the first via 18, although the second via 26 may alternatively be etched in a separate step from etching the first via 18. The stressed region 20 of the semiconductor wafer 12 is disposed between the first via 18 and the second via 26. The first via 18 in the semiconductor wafer 12 is filled with the first filler material 22 and the second via 26 in the semiconductor wafer 12 is filled with a second filler material 28 to further impede dissipation of stress in the stressed region 20 of the semiconductor wafer 12. The second filler material 28 can be any of those set forth above as suitable for the first filler material 22, and the second filler material 28 may be the same or different from the first filler material 22. By etching multiple vias through the stressed crystalline layer 14, complex and versatile transfer of stress into the semiconductor wafer 12 can be accomplished. Further, depending upon the types of filler material employed, additional local stress (i.e., uniaxial stress) can be generated in the semiconductor wafer 12 and the first via 18 and the second via 26 having the stressed region 20 of the semiconductor wafer 12 therebetween may enable such local stress to be generated in a controlled and robust manner. It is to be appreciated that additional vias, beyond the first via 18 and the second via 26 as shown in FIG. 5, may be similarly etched in the stressed crystalline layer 14 and semiconductor wafer 12, followed by filling with filler material, in the same manner as described above depending upon desired stress profiles and semiconductor wafer 12 design.

In another exemplary embodiment of a process for preparing a stressed semiconductor wafer 10, the semiconductor wafer 12 is provided and the stressed crystalline layer 14 is pseudomorphically formed on the surface 16 of the semiconductor wafer 12, as shown in FIG. 1. However, in this embodiment, the second material has a lesser crystalline lattice constant than the first material and the stressed crystalline layer 14 is pseudomorphically formed under tensile stress on the surface 16 of the semiconductor wafer 12. In this embodiment, the stressed semiconductor wafer 10 is prepared having compressive stress therein, which is ideal when a PMOS transistor is to be included on the stressed semiconductor wafer 10 due to increased hole mobility through the compressively stressed semiconductor wafer 10. Again, the semiconductor wafer 12 remains effectively unstressed after pseudomorphically forming the stressed crystalline layer 14 thereon. In one specific example, the semiconductor wafer 12 is a silicon-containing wafer 12 that includes silicon in an amount of from about 95 to about 100 mol % based upon the total amount of atoms in the silicon-containing wafer 12. The silicon-containing wafer 12 has a thickness of from about 50 to about 1500 nm. The stressed crystalline layer 14 is a SiC layer 14 that is pseudomorphically formed on the surface 16 of the silicon-containing wafer 12, where SiC is the second material. The SiC layer 14 has a carbon content of from about 20 to about 40 mol % based upon the total amount of atoms in the SiC layer 14. The SiC layer 14, like the silicon-containing wafer 12, has a thickness of from about 50 to about 1500 nm. The carbon replaces silicon at lattice sites in the crystalline structure of the SiC layer 14, and because carbon is a smaller atom than silicon, the crystalline lattice constant of SiC is lesser than the crystalline lattice constant of silicon. However, because the SiC layer 14 is pseudomorphically formed on the surface 16 of the silicon-containing wafer 12, the SiC layer 14 has the same lattice structure as the substantially pure silicon in the semiconductor wafer 12. Therefore, the SiC layer 14 is formed under tensile stress and exhibits the tensile stress through the bulk thereof.

Figure 6:
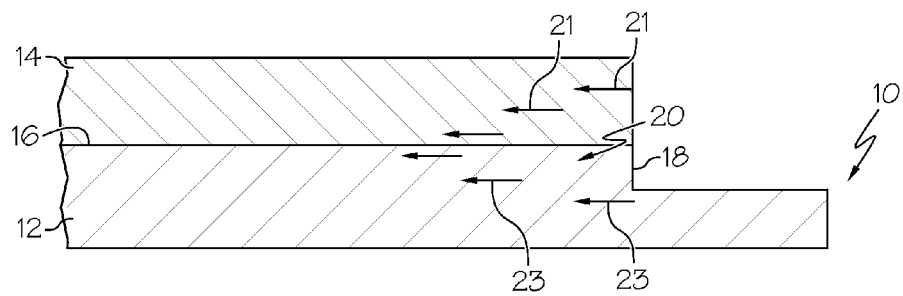
FIG. 6 is a schematic cross-sectional side view of the semiconductor wafer and stressed crystalline layer disposed thereon, as shown in FIG. 1, with a first via etched through the stressed crystalline layer and partially etched into the semiconductor wafer in accordance with another embodiment of a process of the instant invention.

Referring to FIG. 6, the first via 18 is etched through the stressed crystalline layer 14 and at least partially into the semiconductor wafer 12 to release stress in the stressed crystalline layer 14 adjacent the first via 18 in the same manner as described above in the context of FIG. 2. However, as shown in FIG. 6, where the stressed crystalline layer 14 is pseudomorphically formed under tensile stress, relaxation of the stressed crystalline layer 14 results in shrinkage of the stressed crystalline layer 14 (illustrated by the arrows 21 in the stressed crystalline layer 14 as shown in FIG. 6), with stress transferred to the semiconductor wafer 12 in the same direction as shrinkage of the stressed crystalline layer 14 (illustrated by the arrows 23 in the semiconductor wafer 12 as shown in FIG. 6). As a result, the semiconductor wafer 12 is under compressive stress after relaxation of the tensily stressed crystalline layer 14 of this embodiment.

Figure 7:
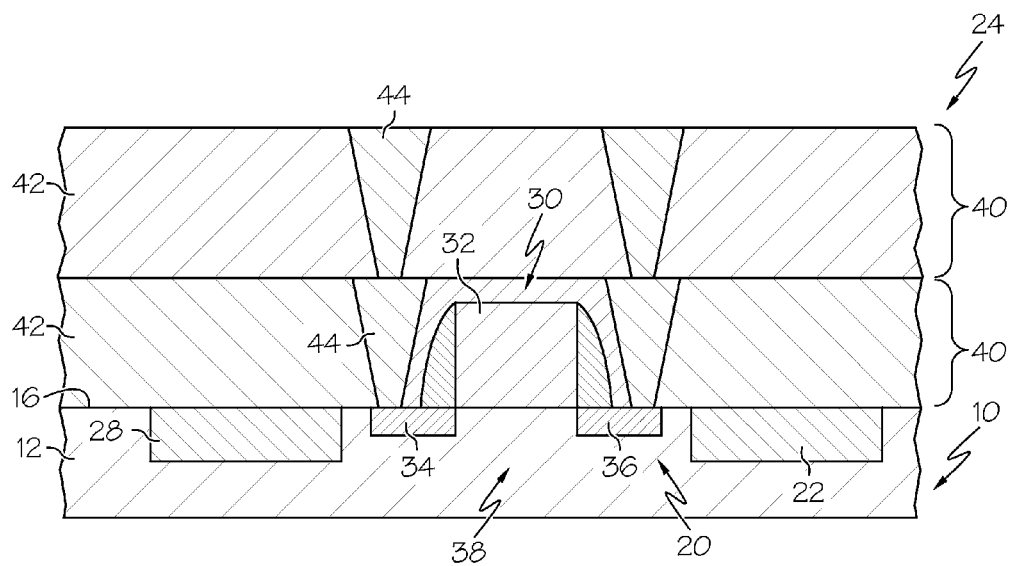
FIG. 7 is a schematic cross-sectional side view of a device including a stressed semiconductor wafer prepared in accordance with an embodiment of another process of the instant invention.

An exemplary embodiment of a process for preparing a device 24 including a stressed semiconductor wafer 10 will now be addressed, with the resulting device 24 shown in FIG. 7. In this embodiment, the stressed semiconductor wafer 10 may be prepared as described above, with the first via 18 and the second via 26 formed therein as described in the context of FIG. 5, followed by filling with the first filler material 22 and the second filler material 28 as also described above. A transistor 30, such as a metal oxide semiconductor (MOS) transistor 30, is formed on the stressed semiconductor wafer 10 within the stressed region 20 thereof. The transistor 30 may be formed on the stressed semiconductor wafer 10 in accordance with conventional designs and includes a gate electrode 32 that is disposed on the stressed semiconductor substrate. A source 34 and a drain 36 are embedded within the stressed semiconductor wafer 10 adjacent to the gate electrode 32 on either side thereof. A region in the semiconductor wafer 12 between the source 34 and the drain 36, and beneath the gate electrode 32, forms a channel 38 of the transistor 30. Although not shown in FIG. 7, it is to be appreciated that millions of the transistors may be formed on the stressed semiconductor wafer 10. Depending upon whether the transistor 30 is a PMOS transistor or NMOS transistor, the stress generated in the stressed semiconductor substrate may appropriately be compressive stress or tensile stress to promote carrier mobility in the channel 38 of the MOS transistor 30. In accordance with the embodiment shown in FIG. 7, at least one level of interconnect routing 40 is formed over the transistor 30 on the semiconductor wafer 12, which is consistent with integrated circuit manufacture. FIG. 7 shows two levels of interconnect routing 40, which generally include a layer of interlayer dielectric material 42 with embedded electrical interconnects 44 disposed therein that can be designed to form complex electrical circuitry that is characteristic of integrated circuits.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A process for preparing a stressed semiconductor wafer, said process comprising:
   providing a semiconductor wafer of a first material having a first crystalline lattice constant;
   pseudomorphically forming a stressed crystalline layer of a second material having a different crystalline lattice constant from the first material on a surface of the semiconductor wafer;
   etching a first via through the stressed crystalline layer and at least partially into the semiconductor wafer to release stress in the stressed crystalline layer adjacent the first via, thereby transferring stress to the semiconductor wafer and forming a stressed region in the semiconductor wafer;
   filling the first via in the semiconductor wafer with a first filler material to impede dissipation of stress in the semiconductor wafer; and
   removing the stressed crystalline layer after filling the first via in the semiconductor wafer.

2. A process for preparing a device including a stressed semiconductor wafer, said process comprising:
   providing a semiconductor wafer of a first material having a first crystalline lattice constant;
   pseudomorphically forming a stressed crystalline layer of a second material having a different lattice constant from the first material on a surface of the semiconductor wafer;
   etching a first via through the stressed crystalline layer and at least partially into the semiconductor wafer to release stress in the stressed crystalline layer adjacent the first via, thereby transferring stress to the semiconductor wafer and forming a stressed region in the semiconductor wafer;
   filling the first via in the stressed semiconductor wafer with a first filler material to impede dissipation of stress in the stressed region of the semiconductor wafer;
   removing the stressed crystalline layer after filling the first via in the semiconductor wafer; and
   forming a transistor on the stressed semiconductor wafer within the stressed region thereof.

3. The process of claim 2, further comprising forming at least one level of interconnect routing over the transistor on the semiconductor wafer.

4. The process of claim 2, wherein the second material has a greater crystalline lattice constant than the first material and wherein pseudomorphically forming the stressed crystalline layer of the second material on the surface of the semiconductor wafer comprises pseudomorphically forming the stressed crystalline layer under compressive stress on the surface of the semiconductor wafer.

5. The process of claim 4, wherein providing the semiconductor wafer comprises providing a silicon-containing wafer and wherein pseudomorphically forming the stressed crystalline layer comprises pseudomorphically forming a silicon germanium layer on the surface of the silicon-containing wafer.

6. The process of claim 5, wherein providing the silicon-containing wafer comprises providing the silicon-containing wafer comprising silicon in an amount of from about 95 to about 100 mol % based upon the total amount of atoms in the silicon-containing wafer and wherein pseudomorphically forming the silicon germanium layer is further defined as pseudomorphically forming the silicon germanium layer having a germanium content of from about 20 to about 40 mol % based upon the total amount of atoms in the silicon germanium layer.

7. The process of claim 5, wherein providing the silicon-containing wafer comprises providing the silicon-containing wafer having a thickness of from about 50 to about 1500 nm and wherein pseudomorphically forming the silicon germanium layer comprises pseudomorphically forming the silicon germanium layer having a thickness of from about 50 to about 1500 nm.

8. The process of claim 2, wherein the second material has a lesser crystalline lattice constant than the first material and wherein pseudomorphically forming the stressed crystalline layer of the second material on the surface of the semiconductor wafer comprises pseudomorphically forming the stressed crystalline layer under tensile stress on the surface of the semiconductor wafer.

9. The process of claim 8, wherein providing the semiconductor wafer comprises providing a silicon-containing wafer and wherein pseudomorphically forming the stressed crystalline layer comprises pseudomorphically forming a silicon carbide layer on the surface of the silicon-containing wafer.

10. The process of claim 9, wherein providing the silicon-containing wafer comprises providing the silicon-containing wafer comprising silicon in an amount of from about 95 to about 100 mol % based upon the total amount of atoms in the silicon-containing wafer and wherein pseudomorphically forming the silicon carbide layer is further defined as pseudomorphically forming the silicon carbide layer having a carbon content of from about 20 to about 40 mol % based upon the total amount of atoms in the silicon carbide layer.

11. The process of claim 9, wherein providing the silicon-containing wafer comprises providing the silicon-containing wafer having a thickness of from about 50 to about 1500 nm and wherein pseudomorphically forming the silicon carbide layer comprises pseudomorphically forming the silicon carbide layer having a thickness of from about 50 to about 1500 nm.

12. The process of claim 2, wherein providing the semiconductor wafer comprises providing the semiconductor wafer formed from the first material chosen from silicon germanium, germanium, gallium arsenide, or indium phosphide.

13. The process of claim 2, wherein etching the first via through the stressed crystalline layer and at least partially into the semiconductor wafer comprises etching the first via into the semiconductor wafer to a depth of from about 10 to about 100 nm from the surface of the semiconductor wafer, provided that the first via is only partially etched into the semiconductor wafer.

14. The process of claim 2, wherein filling the first via in the semiconductor wafer is further defined as epitaxially forming crystalline filler material in the first via.

15. The process of claim 2, wherein filling the first via in the semiconductor wafer is further defined as filling the first via in the semiconductor wafer with an electrically-conductive material.

16. The process of claim 2, further comprising etching a second via through the stressed crystalline layer and at least partially into the semiconductor wafer, with the stressed region of the semiconductor wafer disposed between the first via and the second via, to release stress in the stressed crystalline layer adjacent the second via.

17. The process of claim 16, further comprising filling the second via in the semiconductor wafer with a second filler material to further impede dissipation of stress in the stressed region of the semiconductor wafer.

18. A process for preparing a stressed semiconductor wafer, said process comprising:
    providing a semiconductor wafer of a first material having a first crystalline lattice constant;
    pseudomorphically forming a stressed crystalline layer of a second material having a different lattice constant from the first material on a surface of the semiconductor wafer;
    etching a first via and a second via through the stressed crystalline layer and at least partially into the semiconductor wafer to release stress in the stressed crystalline layer adjacent the first via, thereby transferring stress to the semiconductor wafer and forming a stressed region in the semiconductor wafer with the stressed region of the semiconductor wafer disposed between the first via and the second via; and
    filling the first via and the second via in the semiconductor wafer with a first filler material and a second filler material to impede dissipation of stress in the semiconductor wafer;
    removing the stressed crystalline layer from the semiconductor wafer after filling the first via and the second via in the semiconductor wafer.

* * * * *